United States Patent
Dinnipati et al.

(10) Patent No.: US 12,051,465 B2
(45) Date of Patent: Jul. 30, 2024

(54) SENSE CIRCUIT AND HIGH-SPEED MEMORY STRUCTURE INCORPORATING THE SENSE CIRCUIT

(71) Applicant: GlobalFoundries U.S. Inc., Malta, NY (US)

(72) Inventors: Chandrahasa Reddy Dinnipati, Anantapur (IN); Bipul C. Paul, Mechanicville, NY (US); Ramesh Raghavan, Hyderabad (IN)

(73) Assignee: GlobalFoundries U.S. Inc., Malta, NY (US)

( * ) Notice: Subject to any disclaimer, the term of this patent is extended or adjusted under 35 U.S.C. 154(b) by 230 days.

(21) Appl. No.: 17/812,485

(22) Filed: Jul. 14, 2022

(65) Prior Publication Data

US 2024/0021243 A1    Jan. 18, 2024

(51) Int. Cl.
*G11C 13/00* (2006.01)
*G11C 11/16* (2006.01)

(52) U.S. Cl.
CPC ........ *G11C 13/004* (2013.01); *G11C 11/1673* (2013.01); *G11C 2013/0054* (2013.01); *G11C 2213/79* (2013.01)

(58) Field of Classification Search
CPC ........ G11C 11/1673; G11C 2013/0054; G11C 7/062; G11C 7/065
USPC ......................................................... 365/66
See application file for complete search history.

(56) References Cited

U.S. PATENT DOCUMENTS

| | | | |
|---|---|---|---|
| 7,038,959 B2 | 5/2006 | Garni | |
| 8,587,994 B2 | 11/2013 | Kim et al. | |
| 9,384,792 B2 | 7/2016 | Bonaccio et al. | |
| 9,697,880 B2 | 7/2017 | Andre et al. | |
| 9,959,934 B2 | 5/2018 | Vo | |
| 10,706,905 B1 | 7/2020 | Huang et al. | |
| 11,056,208 B1* | 7/2021 | Jayaraman | G11C 17/18 |
| 2015/0029786 A1 | 1/2015 | Andre et al. | |
| 2023/0087074 A1* | 3/2023 | Lo Giudice | G11C 16/28 365/185.25 |

OTHER PUBLICATIONS

Lee et al., "STT-MRAM Read-circuit with Improved Offset Cancellation," Journal of Semiconductor Technology and Science, vol. 17, No. 3, Jun. 2017, pp. 347-353.

* cited by examiner

*Primary Examiner* — Anthan Tran
(74) *Attorney, Agent, or Firm* — David Cain; Hoffman Warick LLC

(57) ABSTRACT

Disclosed is a sense circuit with first and second branches connected to first and second inputs of an amplifier. The first branch includes series-connected first transistors between a voltage rail and a data line and a first node between two first transistors and connected to the first input. First transistors on either side of the first node receive corresponding gate bias voltages. The second branch includes series-connected second transistors between the voltage rail and a reference device and a second node between two second transistors and connected to the second input. One first transistor and one second transistor share a common control signal. The first and second branches independently and concurrently generate data and reference voltages on the first and second nodes and the difference between them is sensed by the amplifier. Also disclosed are a non-volatile memory structure incorporating the sense circuit and a method.

20 Claims, 9 Drawing Sheets

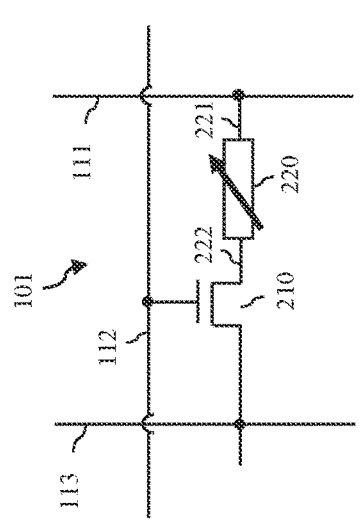
FIG. 2
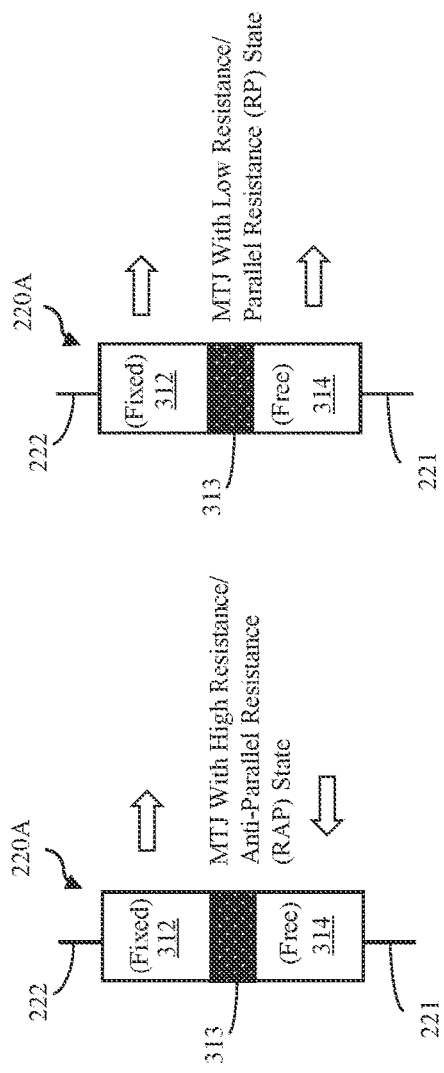
FIG. 3A
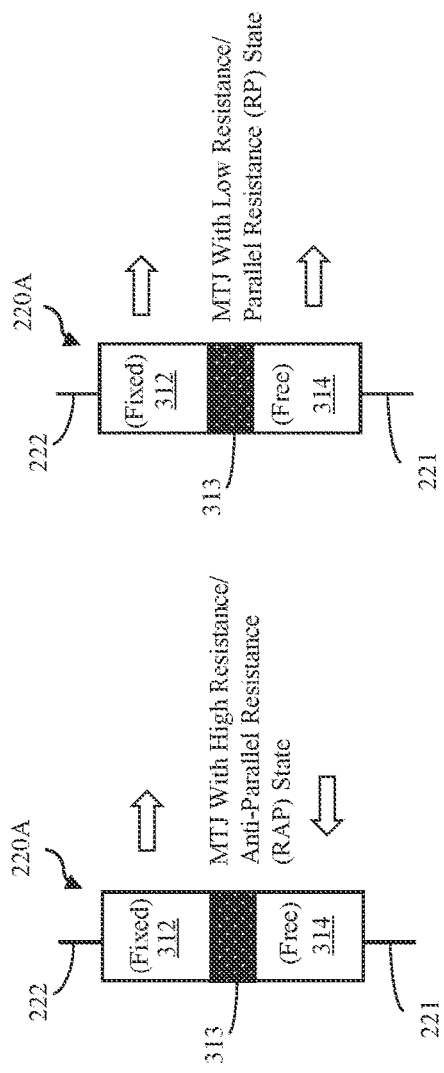
FIG. 3B
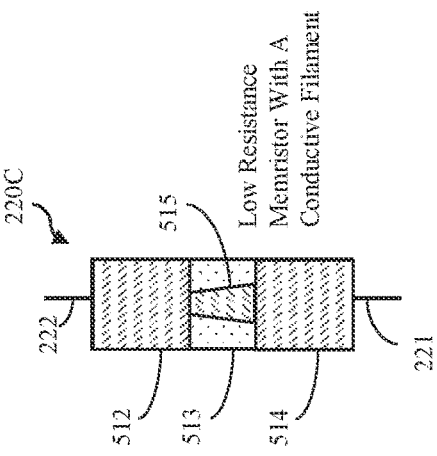
FIG. 4A
FIG. 4B
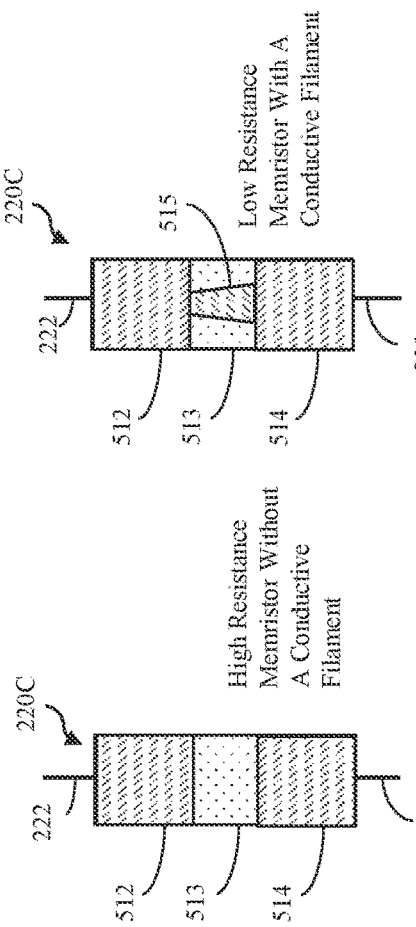
FIG. 5A
FIG. 5B

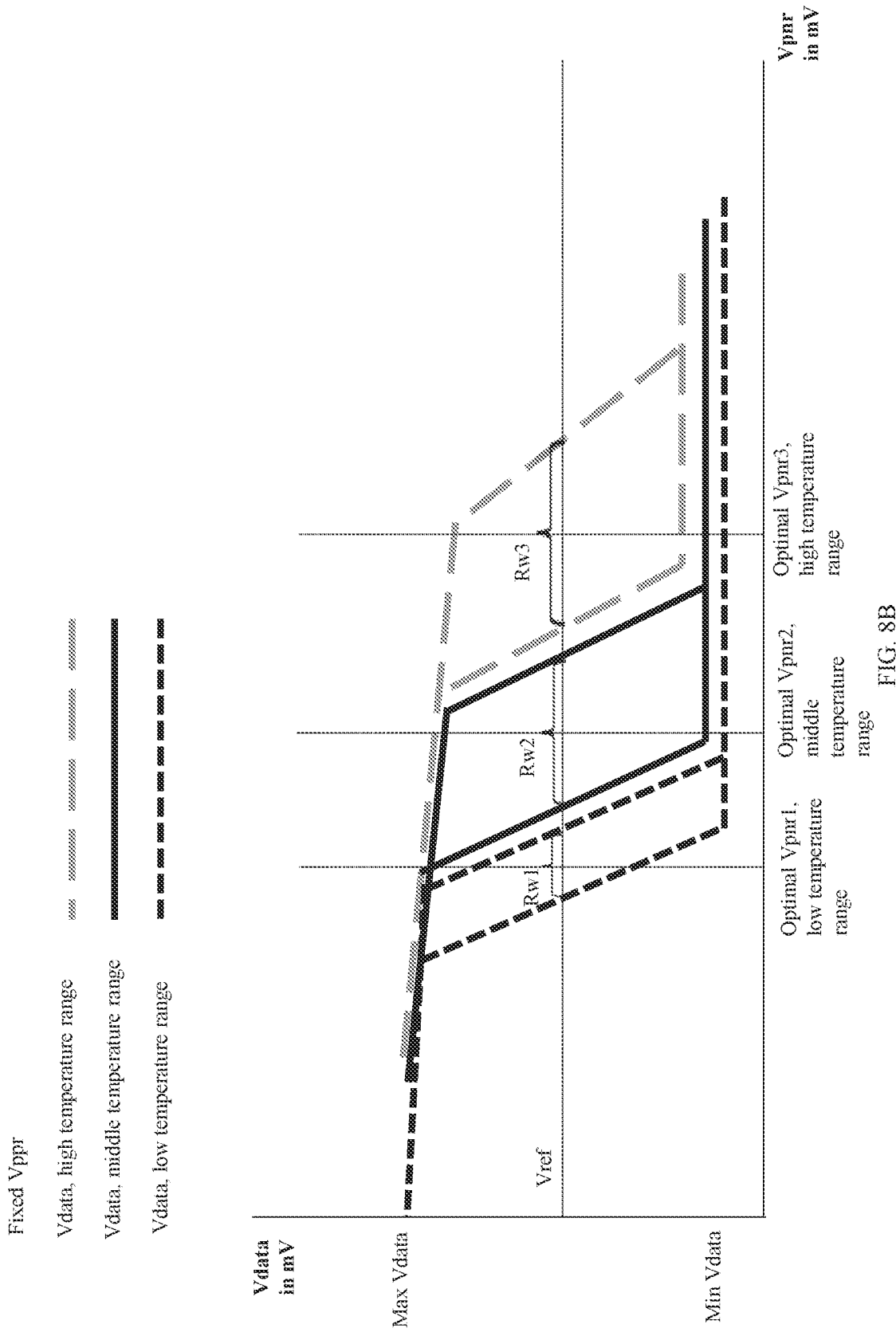

_US 12,051,465 B2_

SENSE CIRCUIT AND HIGH-SPEED MEMORY STRUCTURE INCORPORATING THE SENSE CIRCUIT

BACKGROUND

Field of the Invention

The present invention relates to memory structures and, particularly, to embodiments of a sense circuit and to embodiments of a non-volatile memory (NVM) structure incorporating the sense circuit.

Description of Related Art

Non-volatile memory (NVM) structures can be suitable replacements for other types of memory structures. Advantages associated with NVM structures include, but are not limited to, a reduction in write speeds, a reduction in power consumption, and non-volatility. However, such NVM structures often employ three-stage sensing schemes to perform read operations. Disadvantages associated with three-stage sensing schemes include, but are not limited to, an increase in read delays (i.e., a reduction in read speeds), an increase in the likelihood of temperature-dependent read failures, and an increase in area consumption, due to additional circuitry required for implementation.

SUMMARY

In view of the foregoing, disclosed herein are embodiments of a sense circuit for sensing a data value from a data line and embodiments of a memory structure and, particularly, a non-volatile memory (NVM) structure that incorporates the sense circuit. Specifically, the sense circuit can include two stages: a first stage with a first branch (also referred to herein as a data branch) and a second branch (also referred to herein as a reference branch); and a second stage with an amplifier having first and second inputs (also referred to herein as data and reference inputs). The first and second branches can concurrently (i.e., in parallel) and independently generate data and reference voltages, respectively. In the first branch, a pair of gate bias voltages can specifically be set to control data voltage generation and, optionally, at least one of the gate bias voltages can be variable with different bias levels associated with different operating temperatures to compensate for temperature-dependent read window variations. In any case, the amplifier can receive the data and reference voltages, can compare them, and can output a digital output value depending upon the difference. Because the data and reference voltages are generated in parallel in a first stage (as opposed to sequentially), read speed can be increased over conventional three-stage sensing schemes and area consumption can be reduced (e.g., because additional circuitry for capturing and storing sequentially generated data and reference voltages on the same current path are no longer required).

Specifically, disclosed herein are embodiments of a structure and, particularly, a sense circuit. The sense circuit can include an amplifier, which has a first input and a second input. The sense circuit can further include a first branch connected to the first input and a second branch connected to the second input. Specifically, the first branch can include at least three first transistors, which are connected in series between a voltage rail and a data line. Within the first branch, a first node can be located at a junction between two first transistors and can be connected to the first input of the amplifier. The two first transistors on either side of the first node can receive corresponding gate bias voltages and another first transistor (e.g., connected to the data line) can be controlled by a common control signal. The second branch can include at least two second transistors, which are connected in series between the voltage rail and a reference device. Within the second branch, a second node can be located at a junction between two second transistors and can be connected to the second input of the amplifier. One second transistor can be controlled by the second node and the other of can be controlled by the common control signal.

Aspects of the sense circuit embodiments can include the preceding aspects and, optionally, the following aspects. The first transistors can include a P-type first transistor, an N-type first transistor, and an additional N-type first transistor connected in series between a positive voltage rail and the data line. The first node can be between the P-type first transistor and the N-type first transistor. The second transistors can include P-type second transistor and an N-type second transistor connected in series between the positive voltage rail and the reference device. The second node can be between the P-type second transistor and the N-type second transistor and can further be connected to a gate of the P-type second transistor. Gates of the additional N-type first transistor and the N-type second transistor can receive the common control signal.

Aspects of the sense circuit embodiments can include some or all of the preceding aspects and, optionally, the following aspects. A gate of the P-type first transistor can receive a first gate bias voltage, a gate of the N-type first transistor can receive a second gate bias voltage, and a read window is dependent on the first gate bias voltage and the second gate bias voltage.

Aspects of the sense circuit embodiments can include some or all of the preceding aspects and, optionally, the following aspects. The first gate bias voltage is variable and at different voltage levels for different operating temperatures and the second gate bias voltage is fixed.

Aspects of the sense circuit embodiments can include some or all of the preceding aspects and, optionally, the following aspects. The first branch can further include an additional P-type first transistor having a source region connected to the voltage rail and a drain region connected to the first node. The second branch can further include an additional P-type second transistor having a source region connected to the voltage rail and a drain region connected to a gate of the P-type second transistor and to the second node. Gates of the additional P-type first transistor and the additional P-type second transistor can receive a common precharge control signal.

Aspects of the sense circuit embodiments can include some or all of the preceding aspects and, optionally, the following aspects. The data line can be connected to a memory cell. The memory cell can include an access transistor and a programmable resistor connected in series between a source line and a bitline. A gate of the access transistor can be connected to a wordline.

Aspects of the sense circuit embodiments can include some or all of the preceding aspects and, optionally, the following aspects. The programmable resistor can include any of a magnetic tunnel junction-type programmable resistor, a phase change memory-type programmable resistor, and a memristor. The reference device can include a reference resistor connected in series between the second transistors and ground, where the reference resistance of the reference resistor is at a level between a low programmed resistance of the programmable resistor and a high programmed resistance of the programmable resistor that is higher than the low programmed resistance.

Aspects of the sense circuit embodiments can include some of the preceding aspects and, optionally, the following aspects. The data line can be connected to a memory cell. The memory cell can include a threshold voltage-programmable transistor connected between source and bitlines. A gate of the threshold voltage-programmable transistor can be connected to a wordline. The reference device can include a reference resistor connected in series between the second transistors and ground. The threshold voltage-programmable transistor can have a low resistance when programmed to have a low threshold voltage and a high resistance that is higher than the low resistance when programmed to have a high threshold voltage that is higher than the low threshold voltage. The reference resistance of the reference resistor can be at a level between the low resistance and the high resistance.

Aspects of the sense circuit embodiments can include some of the preceding aspects and, optionally, the following aspects. At the first input the amplifier can receive a data voltage from the first node and at the second input the amplifier can receive a reference voltage from the second node. The amplifier can further compare the data voltage to the reference voltage and can output a digital output based on the difference between the data voltage and the reference voltage.

Aspects of the sense circuit embodiments can include some of the preceding aspects and, optionally, the following aspects. In the amplifier, the first input can be an inverting input and the second input can be a non-inverting input. Thus, the digital output can have a logic value of 0 when the data voltage is higher than the reference voltage indicating that a current path through a specific memory cell connected to the data line has a high resistance, whereas the digital output can have a logic value of 1 when the data voltage is lower than the reference voltage indicating that the current path through the specific memory cell connected to the data line has a low resistance that is less than the high resistance.

Also disclosed herein are embodiments of a memory structure that incorporates such a sense circuit. The memory structure can include an array of memory cells, which are arranged in columns and rows. The memory structure can further include bitlines for the columns with all memory cells in a column being connected to a bitline for that column. The memory structure can further include wordlines for the rows with all memory cells in a row connected to the wordline for that row. The memory structure can further include a multiplexor (MUX). The MUX can have bitline inputs, which are connected to the bitlines for the columns, respectively, and a data line output, which is connected to a data line. The MUX can further selectively connect at least one of the bitlines at the bitline inputs to the data line at the data line output. The memory structure can further include a sense circuit, as described above. That is, the sense circuit can include an amplifier, which has a first input and a second input. The sense circuit can further include a first branch connected to the first input and a second branch connected to the second input. Specifically, the first branch can include at least three first transistors, which are connected in series between a voltage rail and a data line. Within the first branch, a first node can be located at a junction between two first transistors and can be connected to the first input of the amplifier. The two first transistors on either side of the first node can receive corresponding gate bias voltages and another first transistor (e.g., connected to the data line) can be controlled by a common control signal. The second branch can include at least two second transistors, which are connected in series between the voltage rail and a reference device. Within the second branch, a second node can be located at a junction between two second transistors and can be connected to the second input of the amplifier. One second transistor can be controlled by the second node and the other of can be controlled by the common control signal.

Aspects of the memory structure embodiments can include the preceding aspects and, optionally, the following aspects. Within the sense circuit, the first transistors can include a P-type first transistor, an N-type first transistor, and an additional N-type first transistor connected in series between a positive voltage rail and the data line. The first node can be at a junction between the P-type first transistor and the N-type first transistor. The second transistors can include a P-type second transistor and an N-type second transistor connected in series between the positive voltage rail and the reference device. The second node can be at a junction between the P-type second transistor and the N-type second transistor and further connected to a gate of the P-type second transistor. Additionally, the gates of the additional N-type first transistor and the N-type second transistor receive the common control signal.

Aspects of the memory structure embodiments can include some or all of the preceding aspects and, optionally, the following aspects. Within the sense circuit, a gate of the P-type first transistor can receive a first gate bias voltage, the gate of the N-type first transistor receives a second gate bias voltage, and a read window is dependent on the first gate bias voltage and the second gate bias voltage.

Aspects of the memory structure embodiments can include some or all of the preceding aspects and, optionally, the following aspects. Within the sense circuit, the first gate bias voltage can be variable and at different voltage levels for different operating temperatures, and the second gate bias voltage can be fixed.

Aspects of the memory structure embodiments can include some or all of the preceding aspects and, optionally, the following aspects. Within the sense circuit, the first branch can further include an additional P-type first transistor having a source region connected to the voltage rail and a drain region connected to the first node. The second branch can further include an additional P-type second transistor having a source region connected to the voltage rail and a drain region connected to a gate of the P-type second transistor and to the second node. Gates of the additional P-type first transistor and the additional P-type second transistor receive a common pre-charge control signal.

Aspects of the memory structure embodiments can include some or all of the preceding aspects and, optionally, the following aspects. Each memory cell in a specific column and a specific row within the array can include an access transistor and a programmable resistor connected in series between specific source and bitlines for the specific column. A gate of the access transistor can be connected to a specific wordline for the specific row.

Aspects of the memory structure embodiments can include some or all of the preceding aspects and, optionally, the following aspects. The programmable resistor can include any of a magnetic tunnel junction-type programmable resistor, a phase change memory-type programmable resistor, and a memristor. The reference device can include a reference resistor connected in series between the second transistors and ground. A reference resistance of the reference resistor can be at a level between a low programmed resistance of the programmable resistor and a high programmed resistance of the programmable resistor that is higher than the low programmed resistance.

Aspects of the memory structure embodiments can include some or all of the preceding aspects and, optionally, the following aspects. Each specific memory cell in a specific column and a specific row within the array can include a threshold voltage-programmable transistor connected between specific source and bitlines for the specific column. A gate of the threshold voltage-programmable transistor can be connected to a specific wordline for the specific row. The reference device can include a reference resistor connected in series between the second transistors and ground. A reference resistance of the reference resistor can be at a level between a low resistance of the threshold voltage-programmable transistor when programmed to have low threshold voltage and a high resistance of the threshold voltage-programmable transistor when programmed to have a high threshold voltage.

Aspects of the memory structure embodiments can include some or all of the preceding aspects and, optionally, the following aspects. Within the amplifier of the sense circuit, the first input can be an inverting input that receives a data voltage from the first node and the second input can be a non-inverting input that receives a reference voltage from the second node. The amplifier can compare the data voltage to the reference voltage and can further output a digital output based on the difference between the data voltage and the reference voltage. Thus, the digital output can have a logic value of 0 when the data voltage is higher than the reference voltage indicating that a current path through a specific memory cell connected to the data line has a high resistance, whereas the digital output can have a logic value of 1 when the data voltage is lower than the reference voltage indicating that the current path through the specific memory cell connected to the data line has a low resistance that is less than the high resistance.

Also disclosed herein are method embodiments for operating the above-described structures. Specifically, the method embodiments can include performing a first stage of a read operation. This first stage can include generating, by a first branch of a sense circuit, a data voltage on a first node. The first branch can specifically include first transistors connected in series between a voltage rail and a data line and the first node can be at a junction between two of the first transistors and can further be connected to a first input of an amplifier of the sense circuit. This first stage can also include generating, by a second branch of the sense circuit, a reference voltage on a second node. The second branch can specifically include second transistors connected in series between the voltage rail and a reference device. The second node can be at a junction between two of the second transistors and can further be connected to a second input of the amplifier. The processes of generating the data voltage and generating the reference voltage can be performed concurrently and independently. Specifically, one of the first transistors in the first branch and one of the second transistors in the second branch can receive the same common control signal, which triggers branch operations such that generation of the data voltage and generation of the reference voltage are performed concurrently (i.e., in parallel). Additionally, current paths for the first and second branches are different and two of the first transistors receive corresponding gate bias voltages (which the second transistors do not) such that generation of the data voltage and generation of the reference voltage are independent. The method embodiments can further include performing a second stage of the read operation. The second stage can include comparing, by the amplifier, the data voltage at the first input and the reference voltage at the second input and further outputting, by the amplifier, a digital output based on a difference between the data voltage and the reference voltage.

All aspects, examples and features of the disclosed embodiments mentioned above, illustrated in the drawings, and described further in the detailed description section below can be combined in any technically possible way. While the details of one or more implementations of the disclosed embodiments are set forth herein, two or more aspects of the various implementations of any of the disclosed embodiments, including those described in this summary section, may be combined to form implementations not specifically described herein.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 2 is a schematic diagram illustrating an illustrative resistive NVM cell that can be used for the memory cells of the memory structures shown in FIG. 1A or FIG. 1B;

FIGS. 3A-3B depict high and low resistance states, respectively, of an illustrative magnetic tunnel junction (MTJ)-type programmable resistor that can be incorporated into the resistive NVM cell of FIG. 2;

FIGS. 4A-4B depict high and low resistance states, respectively, of an illustrative phase change material (PCM)-type programmable resistor that can be incorporated into the resistive NVM cell of FIG. 2;

FIGS. 5A-5B depict high and low resistance states, respectively, of an illustrative memristor-type programmable resistor that can be incorporated into the resistive NVM cell of FIG. 2;

FIG. 8B is a graph illustrating multiple different read windows for a sense circuit as shown in FIG. 1A or FIG. 1B given different operating temperatures and using a fixed Vppr;

DETAILED DESCRIPTION

Figure 1A:
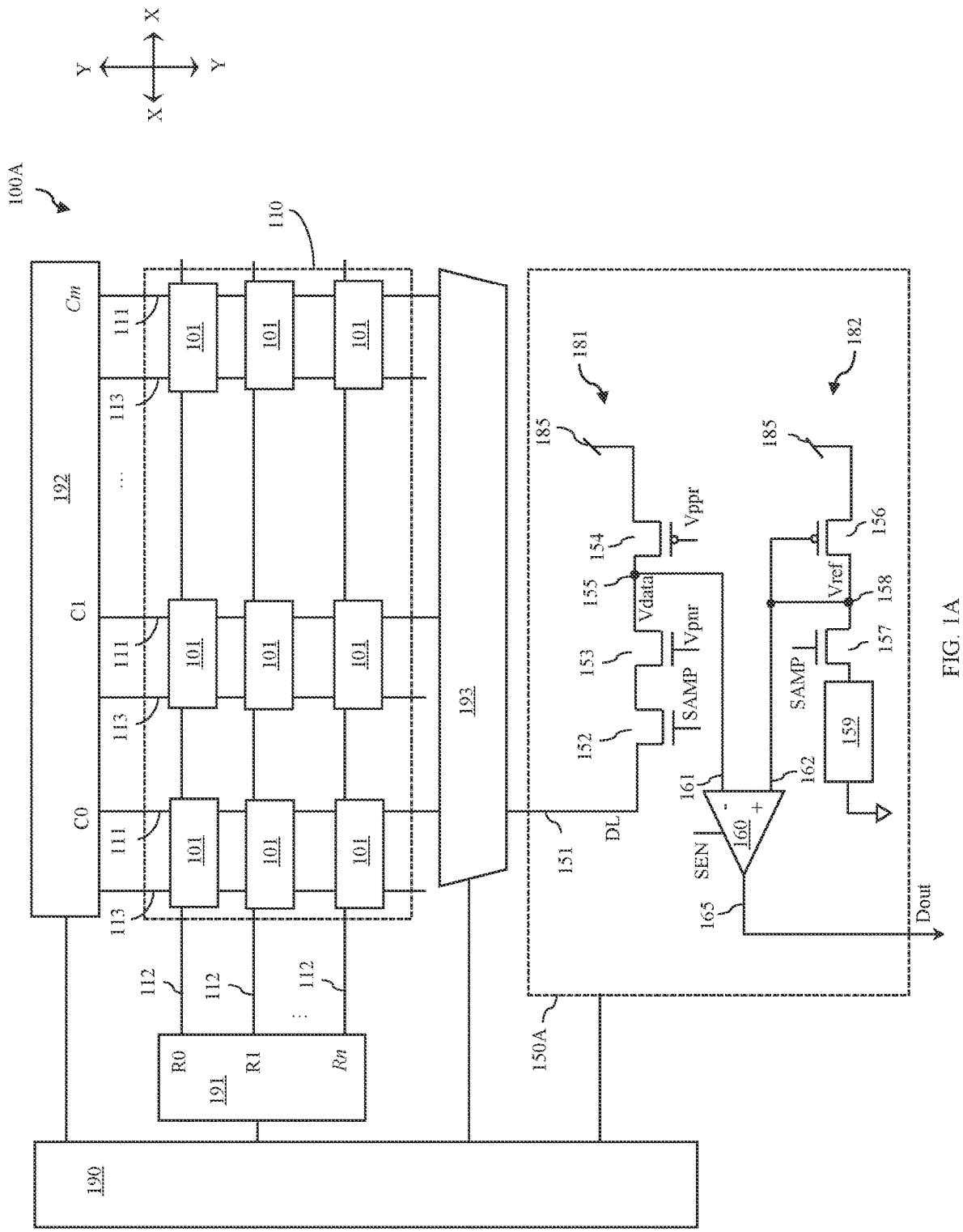
FIG. 1A is a schematic diagram illustrating embodiments of a sense circuit and a memory structure incorporating the sense circuit.

As mentioned above, NVM structures can be suitable replacements for other types of memory structures. Advantages associated with NVM structures include, but are not limited to, a reduction in write speeds, a reduction in power consumption, and non-volatility. However, such NVM structures often employ three-stage sensing schemes to perform read operations. Disadvantages associated with three-stage sensing schemes include, but are not limited to, an increase in read delays (i.e., a reduction in read speeds), an increase in the likelihood of temperature-dependent read failures, and an increase in area consumption, due to additional circuitry required for implementation. More specifically, in such three-stage sensing schemes the same current path is used in first and second stages to generate a data parameter (e.g., data voltage (Vdata)) the level of which varies depending upon the value of a stored bit and a reference parameter (e.g., a reference voltage (Vref)). Vdata and Vref are serially captured and stored at the end of the first and second stages, respectively. Then, in the third stage Vdata and Vref are fed into the inputs of a differential amplifier, which compares them and outputs a digital output (Dout) the value of which varies depending on whether Vdata is greater than Vref or vice versa. For example, if Vdata is greater than Vref, Dout can be a low value (i.e., a logic value of 0), whereas if Vdata is less than Vref, Dout can be a high value (i.e., a logic value of 1). Due to the three-stage sensing process, the read time for a selected NVM cell can be relatively long. Furthermore, serial capture and storage of Vdata and Vref during the first and second stages requires additional area-consuming components (e.g., switches, capacitors, etc.) for implementation.

In view of the foregoing, disclosed herein are embodiments of a sense circuit for sensing a data value from a data line and embodiments of a memory structure and, particularly, a non-volatile memory (NVM) structure that incorporates the sense circuit. Specifically, the sense circuit can include two stages: a first stage with a first branch (also referred to herein as a data branch) and a second branch (also referred to herein as a reference branch); and a second stage with an amplifier having first and second inputs (also referred to herein as data and reference inputs). The first and second branches can concurrently (i.e., in parallel) and independently generate data and reference voltages, respectively. In the first branch, a pair of gate bias voltages can specifically be set to control data voltage generation and, optionally, at least one of the gate bias voltages can be variable with different bias levels associated with different operating temperatures to compensate for temperature-dependent read window variations. In any case, the amplifier can receive the data and reference voltages, can compare them, and can output a digital output value depending upon the difference. Because the data and reference voltages are generated in parallel in a first stage (as opposed to sequentially), read speed can be increased over conventional three-stage sensing schemes and area consumption can be reduced (e.g., because additional circuitry for capturing and storing sequentially generated data and reference voltages on the same current path are no longer required). Also disclosed herein are corresponding sensing method embodiments.

More particularly, FIG. 1A is a schematic diagram illustrating an embodiment of a sense circuit 150A and further illustrating an embodiment of a memory structure 100A that incorporates the sense circuit 150A. Similarly, FIG. 1B is a schematic diagram illustrating an embodiment of a sense circuit 150B and further illustrating an embodiment of a memory structure 100B that incorporates the sense circuit 150B.

Figure 1B:
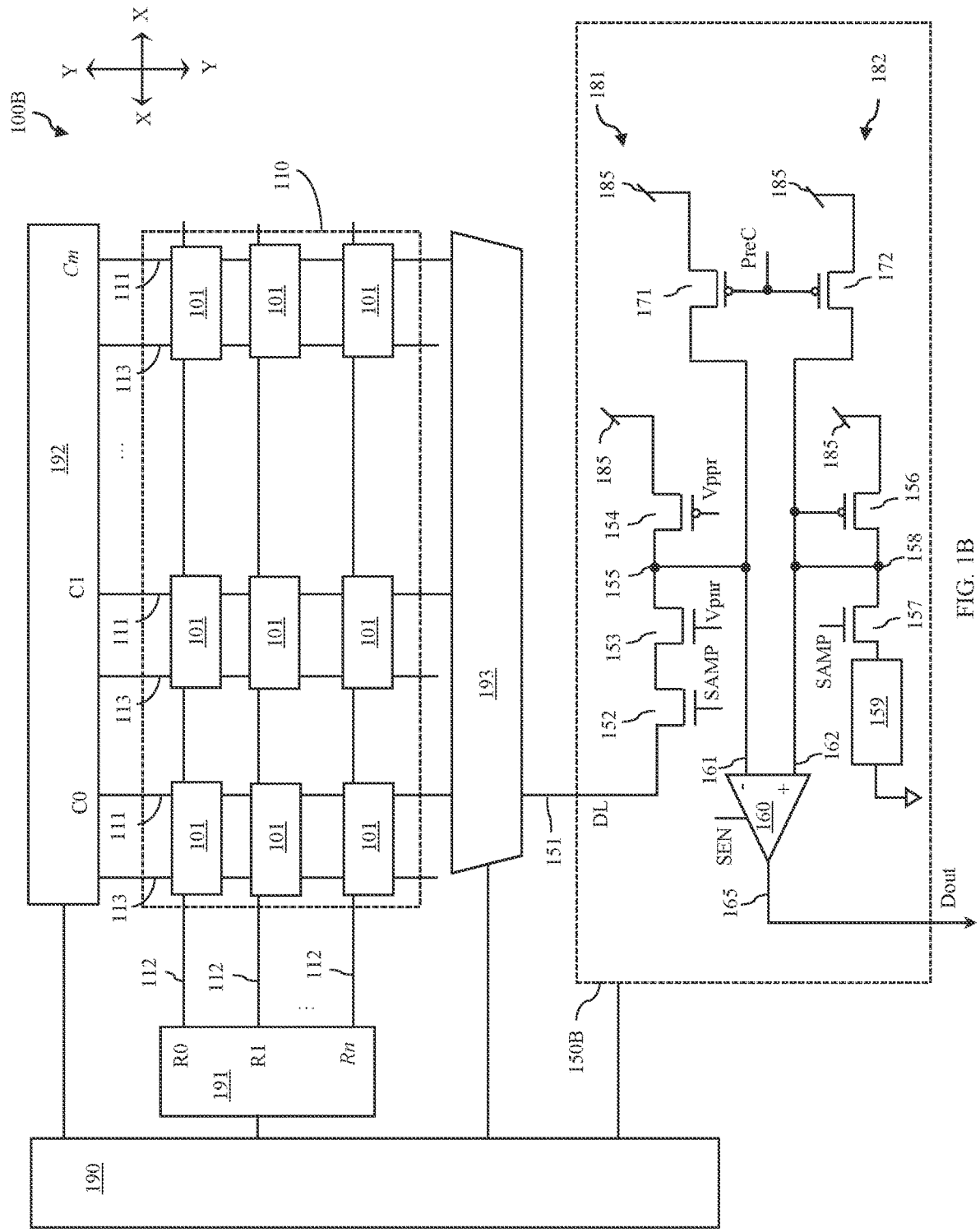
FIG. 1B is a schematic diagram illustrating alternative embodiments of a sense circuit and a memory structure incorporating the sense circuit.

Referring to sense circuit 150A and memory structure 100A of FIG. 1A and to the sense circuit 150B and memory structure 100B of FIG. 1B, in each of the disclosed memory structure embodiments, the memory structure 100A, 100B can include an array 110 of memory cells 101. The memory cells 101 within the array 110 can be arranged in columns (e.g., see columns C0-Cm) and rows (e.g., see rows R0-Rn). For purposes of illustration, the columns are shown on the drawing sheets as being oriented in the Y-direction and the rows are shown on the sheet as being oriented in the X-direction. The orientation of the columns and rows of the memory cells as shown in the figures is not intended to be limiting. Alternatively, the columns could be oriented in the X-direction and the rows could be oriented in the Y-direction. In any case, the columns can be essentially perpendicular to the rows with each memory cell 101 being located at an intersection between one column and one row (i.e., with each memory cell 101 being located within one specific column and one specific row).

The memory structure 100A, 100B can further include bitlines 111 and source line 113 for the columns C0-Cm, respectively. All memory cells 101 in each column can be electrically connected between a source line 113 for the column and a bitline 111 for the same column. The memory structure 100A, 100B can further include wordlines 112 for the rows R0-Rn, respectively. All memory cells 101 in each row can be electrically connected to the wordline 112 for that row.

Within the memory structure 100A, 100B, the memory cells 101 in the array 110 can be, for example, NVM cells of a type that can be read out using a single-ended sensing scheme. Those skilled in the art will recognize that a single-ended sensing scheme refers to a sensing scheme in which a reference parameter value is compared to a sensed parameter value to determine the stored data value in a memory cell as opposed to a dual-ended sensing scheme in which two sensed parameters (e.g., from true and complementary sides of the same cell) are compared to each other to determine a stored data value in a memory cell.

For example, the memory cells 101 can be resistive non-volatile memory (NVM) cells (also referred to herein as resistance programmable NVM cells). FIG. 2 is a schematic diagram illustrating an illustrative resistive NVM cell that can be used for the memory cells 101. This resistive NVM cell can be in a specific column and a specific row within the array 110. The resistive NVM cell can include a programmable resistor 220 (also referred to herein as a variable resistor) and an access transistor 210 (e.g., an n-type field effect transistor (NFET)), which are connected in series between a bitline 111 for the specific column and a source line 113 for the same column. The programmable resistor 220 can have a first terminal 221 connected to the bitline 111 and a second terminal 222 opposite the first terminal 221. The access transistor 210 can have a drain region connected to the second terminal 222 of the programmable resistor 220, a source region connected to the source line 113 for the specific column, and a gate connected to a wordline 112 for the specific row.

The programmable resistor 220 in the resistive NVM of FIG. 2 can be any type of programmable resistor suitable for use in a resistive NVM cell. For example, the programmable resistor 220 could be a magnetic tunnel junction (MTJ)-type programmable resistor, a phase change memory (PCM)-type programmable resistor, or a memristor or any other suitable type of programmable resistor that is configured so that, by applying specific bias conditions to one or both terminals, the resistance of the resistor can be switched between at least two different stable resistance states. For example, the resistance state of such a programmable resistor can be changed to a high resistance state to store a first logic value or to a low resistance state to store a second logic value. The high resistance state can, for example, be programmed into the programmable resistor to store a logic value of "0", whereas a low resistance state can be programmed into the programmable resistor to store a logic value of "1" or vice versa.

FIGS. 3A-3B illustrate an illustrative MTJ-type programmable resistor 220A (also referred to herein as an MTJ-type variable resistor) that could be incorporated into the resistive NVM cell of FIG. 2 (and, thus, used for memory cells 101 of the array 110 in the memory structure 100A or 100B). Such an MTJ-type programmable resistor 220A is typically a back end of the line (BEOL) multi-layer structure, which includes a free ferromagnetic layer 314 (also referred to as a switchable layer) at the first terminal 221, a fixed ferromagnetic layer 312 (also referred to as a pinned layer) at the second terminal 222, and a thin dielectric layer 313 (e.g., a thin oxide layer) between the free ferromagnetic layer 314 and the fixed ferromagnetic layer 312. Depending upon the biasing conditions on the first terminal 221 and the second terminal 222 during a write operation, the MTJ-type programmable resistor 220A exhibits different resistances (e.g., a low resistance or a high resistance that is higher than the low resistance). For example, during a write operation, a high positive voltage (VDD) can be applied to the second terminal 222 and the first terminal 221 can be discharged to ground (e.g., at 0V). In this case, current flow through the device causes the free ferromagnetic layer 314 to switch to (or maintain) the anti-parallel resistance (RAP) state (also referred to as a high resistance state), thereby storing the first logic value (e.g., a logic value of "0") (see FIG. 3A). Alternatively, during the write operation, VDD can be applied to the first terminal 221 and the second terminal 222 can be discharged to ground (e.g., at 0V). In this case, current flow through the device causes the free ferromagnetic layer 314 to switch to (or maintain) a parallel resistance (RP) state (also referred as a low resistance state), thereby storing the second logic value (e.g., a logic value "1") (see FIG. 3B).

FIGS. 4A-4B illustrate an illustrative PCM-type programmable resistor 220B (also referred to herein as a PCM-type variable resistor) that could be incorporated into the resistive NVM cell of FIG. 2 (and, thus, used for the memory cells 101 in the array 110 of the memory structure 100A or 100B). Such a PCM-type programmable resistor employs a phase change material 411 (e.g., a chalcogenide compound) with programmable structural phases that exhibit different resistances (e.g., a low resistance crystalline phase and a high resistance amorphous phase). Switching of the structural phase is dependent upon the local temperature, which is controlled by the length and strength of an applied voltage. For example, switching from a crystalline phase (i.e., a low resistance state) to an amorphous phase (i.e., a high resistance state) to store the first logic value (e.g., a logic value of "0") can be achieved by applying a short high voltage pulse to one or both terminals 221-222 to quickly heat the phase change material above its melting point (see FIG. 4A). Switching from the amorphous phase to the crystalline phase to store the second logic value (e.g., a logic value of "1") can be achieved by applying a longer lower voltage pulse to one or both terminals 221-222 to heat the phase change material to its crystallization temperature and then allowing it to cool (see FIG. 4B).

FIGS. 5A-5B illustrate an illustrative memristor 220C that could be incorporated into a resistive NVM cell of FIG. 2 (and, thus, used for the memory cells 101 in the array 110 of the memory structure 100A or 100B). Such a memristor is also typically a back end of the line (BEOL) multi-layer structure, which includes two metallic layers 512 and 514 separated by a dielectric region 513 (also referred to herein as a resistance switching region). Depending on the specific materials used and on the biasing conditions on the first terminal 221 and the second terminal 222 during a write operation, ions in the dielectric region 513 may migrate to: (a) break-down conductive filament(s) within the dielectric region 513 between the metallic layers 512 and 514 so that the resistance of the memristor increases to, for example, a high resistance state to store the first logic value (e.g., a logic value of "0") or (b) grow conductive filament(s) 515 within the dielectric region 513 extending between the metallic layers 512 and 514 so that the resistance of the dielectric region decreases to, for example, a low resistance state to store the second logic value (e.g., a logic value of "1"). Those skilled in the art will recognize that the total number of stable resistance states achievable with such a memristor can vary depending upon the materials used and the biasing conditions. Metal or metal alloy materials for the metallic layers could include, for example, platinum (Pt), titanium (Ti), titanium nitride (TiN), or some other suitable metal or metal alloy material. Dielectric materials for the dielectric region could include an oxide layer, such as a tantalum oxide (Ta2O5) layer, a hafnium oxide (HfO2) layer, an iron oxide (Fe2O3) layer, a titanium oxide (TiO2) layer, or some other suitable oxide layer. Optionally, such a memristor could further include one or more interface barrier layers (e.g., a second oxide layer, such as aluminum oxide (Al$_2$O$_3$) or some other oxide layer, an amorphous silicon layer, or some other suitable interface barrier layer) between the oxide layer and one or both metallic layers (e.g., to improve switching characteristics).

Alternatively, the memory cells 101 could be NVM cells of any other type that can be read out using a single-ended sensing scheme. For example, the memory cells 101 could be threshold voltage (Vt)-programmable transistor NVM cells.

Figure 6:
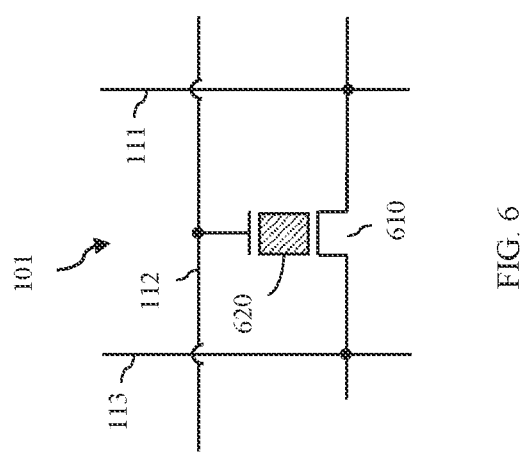
FIG. 6 is a schematic diagram illustrating an illustrative Vt-programmable transistor NVM cell that could be used for the memory cells of the memory structures shown in FIG. 1A or FIG. 1B.

FIG. 6 is a schematic diagram illustrating an illustrative Vt-programmable transistor NVM cell that could be used for the memory cells 101 in the array 110 of the memory structure 100A or 100B. The Vt-programmable transistor NVM cell can be located at a specific column and a specific row and can include a Vt-programmable FET 610 (e.g., a Vt-programmable NFET). The Vt-programmable FET can include: a gate 620, which is electrically connected to the wordline 112 for the specific row; a drain region, which is electrically connected to the bitline 111 for the specific column; and a source region, which is electrically connected to the source line 113 for the specific column. The gate 620 can be configured so that, depending upon biasing conditions applied to the gate, source and drain terminals, the Vt of the transistor can be selectively programmed (i.e., changed) and, more particularly, the Vt can be switched between a high-Vt state, where the transistor is more resistive, to store the first logic value (e.g., a logic value of "0") and a low-Vt state, where the transistor is less resistive/more conductive, to store the second logic value (e.g., a logic value of "1"). Thus, the gate 620 can effectively function as a data storage node. Vt-programmable FETs include, but are not limited to, charge trap field effect transistors (CTFETs), ferroelectric field effect transistors (FeFETs), and floating gate field effect transistors (FGFETs). Such Vt-programmable FETs are well known in the art and, thus, the details thereof are omitted from this specification in order to allow the reader to focus on the salient aspects of the disclosed embodiments.

Referring again to FIGS. 1A and 1B, the memory structure 100A, 100B can further include a controller 190 and peripheral circuitry 191-193 in communication with the controller 190, connected to the bitlines 111, source lines 113, and word lines 112 of the array 110 and configured to facilitate memory cell operations (e.g., write and read) in response to various signals (as discussed in greater detail below) from the controller 190. The peripheral circuitry can include a row control block 191, which is electrically connected to the WLs 112 for the rows, and which includes, for example, address decode logic and wordline drivers for appropriately biasing specific wordlines depending upon the type of memory cell and the mode of operation. The peripheral circuitry can also include a column control block 192, which is electrically connected to bitlines 111 and source lines 113 for the columns and which includes, for example, address decode logic, bitline drivers and source line drivers for appropriately biasing specific bitlines and source lines depending upon the type of memory cell and the mode of operation. The peripheral circuitry can also include a multiplexor 193 (MUX). The MUX 193 can have multiple bitline inputs and each bitline input can be connected to a corresponding one of the bitlines 111 for multiple columns. The MUX 193 can further have a data line output connected to a data line (DL) 151. The MUX 193 can be configured to selectively connect a specific bitline for a specific column to the DL 151 in response to control signals from the controller 190 during a read operation (also referred to herein as a sensing operation) directed to a selected memory cell 101 in the array 110 and located in the specific column and at a specific row. Generally, except for the novel features of the disclosed embodiments related to the sense circuit 150A, 150B and its incorporation into the memory structure 100A, 100B, the peripheral circuitry features described above are well known in the art and, thus, details of the peripheral circuitry have been omitted from the specification to allow the reader to focus on the salient aspects of the disclosed embodiments.

The peripheral circuitry of the memory structure 100A, 100B can also include a sense circuit 150A, 150B. The sense circuit 150A, 150B can be connected to the array 110 via the data line 151 and the MUX 193 and further in communication with the controller 190.

The sense circuit 150A, 150B can include an amplifier 160 (e.g., a differential amplifier). The amplifier 160 can have a first input 161 (also referred to herein as a data input), a second input 162 (also referred to herein as a reference input), and an output 165. The state of the amplifier 160 can be controlled by a sense enable signal (SEN). When SEN is low, the amplifier 160 can be in a standby mode. When SEN is high, the amplifier 160 can be in an operational mode, can compare a data voltage (Vdata) at the first input 161 to a reference voltage (Vref) at the second input 162, and can output a digital output (Dout) at the output 165 based on the difference between the two inputs. For example, one of the inputs can be an inverting input (−) and one can be a non-inverting input (+). In embodiments where a designer intends a high resistance current path through a memory cell 101 (e.g., through a programmable resistor or through a Vt-programmable transistor) to represent a logic value of 0 and a low resistance current path through the memory cell 101 to represent a logic value of 1, the first input 161 that receives Vdata will be the inverting input (−) and the second input 162 that receives Vref will be the non-inverting input (+) (as illustrated and described in greater detail below). In this case, when Vdata is greater than the Vref, Dout at the output 165 will be low (e.g., will represent a logic value of 0); whereas, when the Vdata is lower than the Vref, Dout will be high (e.g., will represent a logic value of 1). It should, however, be understood that if, alternatively, a designer intends a high resistance current path through a memory cell 101 (e.g., through a programmable resistor or through a Vt-programmable transistor) to represent a logic value of 1 and a low resistance current path through the memory cell 101 to represent a logic value of 0, then first input 161 that receives Vdata would be the non-inverting input and the second input 162 that receives Vref would be the inverting input. Those skilled in the art will recognize that differential amplifier circuits configured to function as described above are well known in the art and, thus, the details thereof have been omitted from this specification in order to allow the reader to focus on the salient aspects of the disclosed embodiments.

The sense circuit 150A, 150B can further include a first branch 181 (also referred to herein as a data branch). The first branch 181 can include first transistors, can be configured to generate Vdata and can be connected to the first input 161 of the amplifier 160 so that Vdata is applied to the first input 161. The sense circuit 150A, 150B can also include a second branch 182 (also referred to herein as a reference branch). The second branch 182 can include second transistors, can be configured to operate in parallel with the first branch 181 to independently generate Vref and can be connected to the second input 162 of the amplifier 160 so that Vref is applied to the second input 162.

More particularly, the first branch 181 can include at least three series-connected first transistors 152-154. The series-connected first transistors can include, for example, a first PFET 154, a first NFET 153, and an additional first NFET 152, which are connected in series between a positive voltage rail 185 (e.g., at Vdd) and DL 151. Within the first branch 181, the first PFET 154 and the first NFET 153 can be controlled by corresponding gate bias voltages (Vppr and Vpnr, respectively). Specifically, the first PFET 154 can have a gate have a gate connected to receive a first gate bias voltage (Vppr) and the first NFET 153 can have a gate connected to receive a second gate bias voltage (Vpnr), as discussed in greater detail below. Vppr and Vpnr can, for example, be received from the controller 190 or from some other on-chip bias voltage generation circuit in communication with the controller 190, not shown. Within the first branch 181, the additional first NFET 152, which is connected between the first NFET 153 and the DL 151, can be controlled by a control signal (SAMP). That is, the gate of the additional first NFET 152 can be connected to receive SAMP. As discussed in greater detail below, SAMP can also be a common sample control signal for one of the second transistors in the second branch 182. The first branch 181 can further include a first node 155 (also referred to herein as a data node), which is at the junction between the first PFET 154 and the first NFET 153. As discussed in greater detail below, Vdata can be generated on the first node 155 during a read operation and can swing between a maximum Vdata level and a minimum Vdata level depending upon Vppr, Vpnr, and further on the stored data value in a selected memory cell (as indicated by the input to the sense circuit from DL 151).

The second branch 182 can include at least two series-connected second transistors. The two series-connected second transistors can include a second PFET 156 and a second NFET 157, which are connected in series between the positive voltage rail 185 and a reference device 159.

The reference device 159 can further be connected between the second NFET 157 and ground. The reference device 159 can be, for example, a reference resistor. The reference resistor can include one or more resistive elements having either a fixed resistance (e.g., a polysilicon resistor) or a stable programmed resistance at some desired resistance level. For example, if the memory cells 101 include programmable resistors (e.g., as in the NVM cells described above and illustrated in FIG. 2), the reference resistor could be designed or programmed to have a predetermined resistance at some level between (e.g., the average of or approximately midway between) the resistance in the current path through a memory cell when the programmable resistor 220 is in the low resistance state and the resistance in the current path through a memory cell when the programmable resistor 220 is in the high resistance state. If the memory cells 101 include Vt-programmable transistors (e.g., as described above and illustrated in FIG. 6), the reference resistor could be designed or programmed to have a predetermined resistance at some level between (e.g., the average of or approximately midway between) the resistance in the current path through a memory cell when the Vt-programmable transistor 610 has a low Vt (and, thus, is less resistive to current flow) and the resistance in the current path through a memory cell when the Vt-programmable transistor has a high Vt (and, thus, is more resistive).

The second branch 182 can further include a second node 158 (also referred to herein as a reference node), which is at the junction between the two second transistors (i.e., between the second PFET 156 and the second NFET 157). Vref can be generated on the second node 158 during the read operation such that is at some level between (e.g., about halfway between) the maximum and minimum Vdata levels. Within the second branch 182, the second PFET 156 can be controlled by the second node 158. That is, the gate of the second PFET 156 can be connected to receive Vref from the second node 158 in a feedback loop. Additionally, within the second branch, the second NFET 157 can be controlled by SAMP (i.e., the same common sample control signal that controls the additional first NFET 152, as discussed above). That is, the gate of the second NFET 157 can be connected to receive SAMP. Thus, during a read operation, the additional first NFET 152 in the first branch 181 and the second NFET 157 in the second branch 182 will essentially concurrently turn on when SAMP switches to high and off when SAMP switches to low.

Optionally, in some embodiments, the first and second branches 181-182 can include additional first and second PFETs 171-172, respectively (e.g., see the sense circuit 150B in the memory structure 100B of FIG. 1B). Specifically, in the first branch 181, the additional first PFET 171 can have a source region connected to the positive voltage rail 185 and a drain region connected to the first node 155 and to the first input 161 of the amplifier 160. In the second branch 182, the additional second PFET 172 can have a source region connected to the positive voltage rail 185 and a drain region connected to the gate of the second PFET 156, to the second node 158, and to the second input 162 of the amplifier 160. The additional first and second PFETs 171-172 can be pre-charge transistors, which pull-up the voltage levels (i.e., pre-charge) of the first node 155 and the second node 158 prior to a read operation, as discussed in greater detail below, and which are controlled by a common pre-charge control signal (PreC). That is, the gates of both the additional first and second PFETs 171-172 can be connected to receive PreC.

For purposes of illustration, the various first transistors in the first branch 181 and the various second transistors in the second branch 182 are described above and illustrated in the figures as being FETs. However, the description and the drawings are not intended to be limiting. Alternatively, the first and second transistors could be replaced by bipolar junction transistors (BJTs) (e.g., PNP-type BJTs in place of PFETs and NPN-type BJTs in place of NFETs), heterojunction bipolar transistors (HBTs), or any other suitable type of three-terminal transistor.

Figures 7A, 7B:
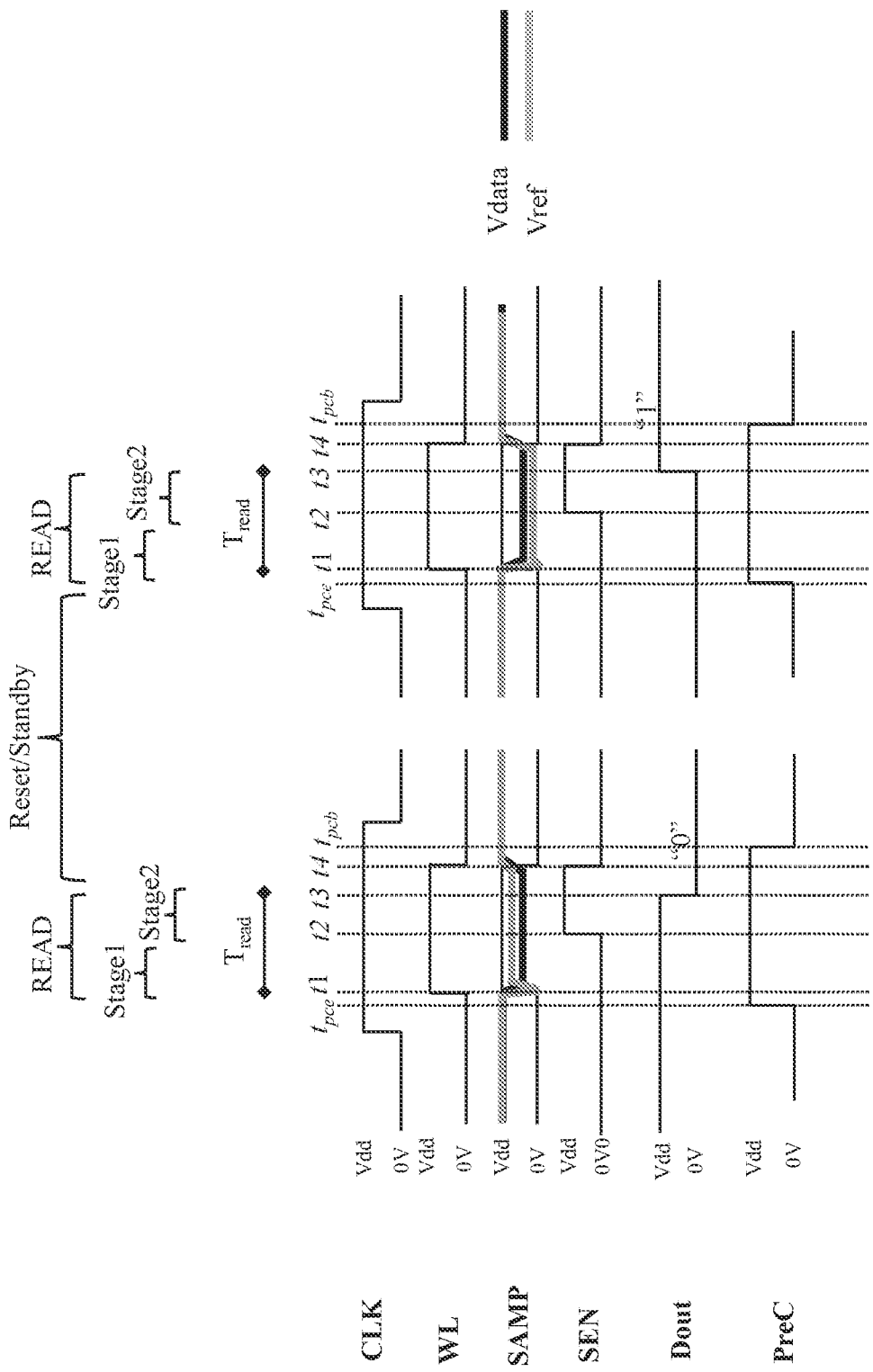
FIG. 7A is an illustrative timing diagram illustrating various signals during a read operation performed by the sense circuit of FIG. 1A or FIG. 1B when the data output (Dout) is low.
FIG. 7B is an illustrative timing diagram illustrating various signals during a read operation performed by the sense circuit of FIG. 1A or FIG. 1B when the data output (Dout) is high.

FIGS. 7A and 7B are illustrative timing diagrams illustrating various signals during a read operation (also referred to herein as a sensing operation) performed by the sense circuit 150A, 150B. Such a read operation can be performed, for example, to sense the logic value of data stored within a selected memory cell, which is in a specific row and connected to the specific WL for that specific row, and which is further located in a specific column and connected to a specific bitline and to a specific source line for that specific column. It should be noted that, during this read operation, the specific source line can be connected to ground. FIG. 7A illustrates, for example, these signals during a read 0 operation when the memory cell is in a high resistance state such that a logic value of 0 is stored therein. FIG. 7B illustrates, for example, these same signals during a read 1 operation when the memory cell is in a low resistance state such that a logic value of 1 is stored therein.

Optionally (e.g., in the case of the sense circuit 150B of the memory structure 100B of FIG. 1B), before and after the read operation (i.e., before time (t1) and after time (t4) during which the read operation is performed), PreC can be low (e.g., at 0V). Thus, before and after the read operation, the additional first and second PFETs 171-172 are held in an on-state, thereby pulling-up (i.e., pre-charging) the voltage levels on the first node 155 and the second node 158 (e.g., to Vdd). Shortly before the read operation (i.e., shortly before time (t1)) at the noted pre-charge end time ($t_{pce}$), PreC will be pulsed and, particularly, switched to high (e.g., Vdd) and remain high until shortly after the read operation (i.e., until shortly after time (t4)) at the noted pre-charge begin time ($t_{pcb}$). As a result, during the read operation, the additional first and second PFETs 171-172 are held in an off-state such that the voltage levels on the first node 155 and second node 158 are no longer being controlled by the additional first and second PFETs 171-172 and, more particularly, no longer being actively pulled-up. In some embodiments, Vdd can be, for example, between approximately 1V and 1.5V.

Alternatively, in the case of the sense circuit 150A of the memory structure 100A of FIG. 1B, the first node 155 and the second node 158 could be left floating just prior to initiation of the read operation at t1.

At or near t1, the MUX 193 connects the bitline for the column containing the selected memory cell 101 to the DL 151 and at t1 the read operation begins when the WL 112 for the row containing the selected memory cell switches from 0V to Vdd. If the selected memory cell 101 is a resistive NVM cell, e.g., as shown in FIG. 2, switching of the WL 112 to Vdd causes the access transistor 210 to turn on, establishing a current path between the bitline 111 and source line 113 through the NVM cell (i.e., through the programmable resistor 220 and access transistor 210) and the NVM cell. If the selected memory cell 101 is an NVM cell that includes a Vt-programmable NFET, e.g., as shown in FIG. 6, switching of the WL 112 to Vdd biases the gate of the Vt-programmable NFET, establishing a current path between the bitline 111 and source line 113 through the Vt-programmable transistor.

Also, at or near t1, SAMP switches from 0V to Vdd, turning on both the additional first NFET 152 in the first branch 181 and the second NFET 157 in the second NFET 157. Within the first branch 181, the first PFET 154 and the first NFET 153 have gates biased by Vppr and Vpnr, respectively, such that turning on the additional first NFET 152 establishes a full data current path that extends from the positive voltage rail 185, through the first branch 181, the DL 151, the bitline 111, and the selected memory cell to ground. As illustrated just following t1, when the additional first NFET 152 turns on, Vdata generated on the first node 155 will exhibit an initial pull-down. If the selected memory cell (or more particularly the programmable resistor or Vt-programmable FET therein) is in a high resistance state, the voltage level on DL 151 will be high and Vdata on the first node 155 will rise back up while SAMP is high. If the selected memory cell (or more particularly the programmable resistor or Vt-programmable FET therein) is in a low resistance state, the voltage level on DL 151 will drop and Vdata on the first node 155 will remain low while SAMP is high.

Concurrently (i.e., in parallel), within the second branch 182, turning on the second NFET 157 ensures the Vref on the second node 158 will settle at some predetermined voltage level between the minimum and maximum Vdata levels. The second NFET 157 pulls down Vref on the second node 158, but the pull-down is limited by the resistance of the reference device 159 (which as mentioned above is, by design, has a resistance that is approximately mid-way between the resistances of the two resistance states of the memory cell 101 so that Vref will be approximately midway between a max Vdata and a min Vdata) and that is also limited by the second PFET 156 (which is controlled by the level of Vref on the second node 158 and which will exhibit increased conductivity and pull up the voltage level on the second node 158 if it drops too low). The second PFET 156 pulls up Vref on the second node 158, but the pull-up is limited by Vref itself because Vref controls the conductivity of the second PFET 156 (i.e., as Vref increases, the conductivity of the second PFET 156 decreases). Thus, while the same SAMP turns on the first branch 181 and the second branch 182 in parallel during the read operation, generation of Vdata on the first node 155 and generation of Vref on the second node 158 are independent.

At time 2 (t2), after Vdata has had sufficient time to settle above or below Vref (e.g., at the mid-point between the rising and falling edges of SAMP), SEN can go high to enable the amplifier 160, which begins the comparison of Vdata and Vref. At time 2 (t2), after Vdata has had sufficient time to settle above or below Vref (e.g., at some predetermine point between the rising and falling edges of SAMP), SEN can go high to enable the amplifier 160, which captures and begins to compare Vdata and Vref. At time 3 (t3), after the amplifier 160 has had sufficient time to compare Vdata and Vref (e.g., at some predetermined point between the rising and falling edges of SEN), the amplifier 160 can output Dout. In this example, if Vdata is greater than Vref between t3 and time 4 (t4), then Dout will be a logic value of 0 (see FIG. 7A); whereas, if Vdata is less than Vref between t3 and t4, then Dout will be a logic value of 1 (see FIG. 7B).

At t4, following output of Dout by the amplifier, WL, SEN and SAMP can all go low, placing the sense circuit 150A, 150B in a standby mode.

As mentioned above, if applicable (e.g., in the case of the sense circuit 150B), shortly following t4 and, particularly, at $t_{pcb}$ PreC will switch to low again to begin pre-charging of the voltage levels on the first node 155 and the second node 158 until just prior to the next read operation.

It should be noted that timing of the sense circuit can be controlled by a clock signal (CLK) (e.g., as shown in FIGS. 7A-7B). The use of CLKs to control the timing of circuits and, particularly, of memory circuits is well known in the art and, thus, the details of CLK have been omitted from this specification in order to allow the reader to focus on the salient aspects of the disclose embodiments.

In any case, operation of the sense circuit 150A, 150B in this manner effectively reduces the total read time (Tread) (i.e., the time between the rising edge of the WL at t1 to output of Dout by the amplifier 160 at t3). For example, Tread in three-stage sensing schemes is typically around 7.0 ns, but Tread using the sense circuit 150A, 150B can be approximately 3.0 ns or even less (e.g., <2.6 ns).

Furthermore, as mentioned above, Vdata generated on the first node 155 during the read operation and can swing between a maximum Vdata level (e.g., 800 mV or some other suitable max Vdata) and a minimum Vdata level (e.g., 0V or some other suitable min Vdata less than the max Vdata) depending upon Vppr, Vpnr, and on the stored data value in a selected memory cell. The optimal gate bias voltages (Vppr and Vpnr) can be selected to establish a read window that will enable detection of the difference between Vdata and Vref by the amplifier 160. For example, referring to FIG. 8A, at a nominal operating temperature (e.g., 25° C. or some other suitable nominal operating temperature) and with a fixed Vppr (e.g., a Vppr of 425 mV or some other suitable fixed Vppr), actual Vdata will vary as a function of both the stored data value in the memory cell (i.e., whether the memory cell is in a low or high resistance state) and Vpnr. Specifically, Vdata will drop from max Vdata to min Vdata at a lower Vpnr when the resistance state in a memory cell is low than it does when the resistance state in the memory cell is high. Given the fixed Vppr, the range between a first Vpnr when Vdata will drop due to a low resistance state in the memory cell and a second Vpnr when Vdata will drop due to a high resistance state in the memory cell is referred to herein as the read window (Rw). Given the fixed Vppr, the optimal Vpnr selected for use during a read operation will be between the first Vpnr and the second Vpnr so that it is sufficiently high to pull Vdata down below Vref when the memory cell is in the low resistant state, but not sufficiently high to pull Vdata down below Vref when the memory cell is in the high resistance state.

It should, however, be noted that Rw can shift as a function of temperature, as shown in FIG. 8B. Consider a sense circuit designed to have a max Vdata at, for example, 800 mV, a min Vdata at, for example, 0V, and a Vref at, for example, 400 mV. Specifically, different operating temperature ranges, such as a low temperature range (e.g., below 0° C. or some other low temperature range that includes, for example, −40° C.), a middle or nominal operating temperature range (e.g., between 0° C. and 100° C. or some other nominal operating temperature range that includes, for example, 25° C.), and high temperature range (e.g., over 100° C. or some other high temperature range that includes, for example, 125° C.) can have different read windows (e.g., Rw1, Rw2, and Rw3) and, thus, different optimal Vpnrs, such as a low Vpnr1 for the low temperature range (e.g., 475 mV or some other suitable low Vpnr1), a middle Vpnr2 for the middle temperature range (e.g., 525 mV or some other suitable middle Vpnr2), and high Vpnr3 for the high temperature range (e.g., 650 mV or some other suitable high Vpnr3). If techniques are not employed to compensate for the temperature dependent Rw shifts, read errors can occur. For example, if the optimal Vpnr2 for Rw2 is used across all operating temperatures and if no adjustment is made to account for the temperature dependent Rw shifts at high and/or low operating temperatures, Dout could be either a false 1 (e.g., if the Rw shifts downward) or a false (e.g., if Rw shifts upward).

Figure 8A:
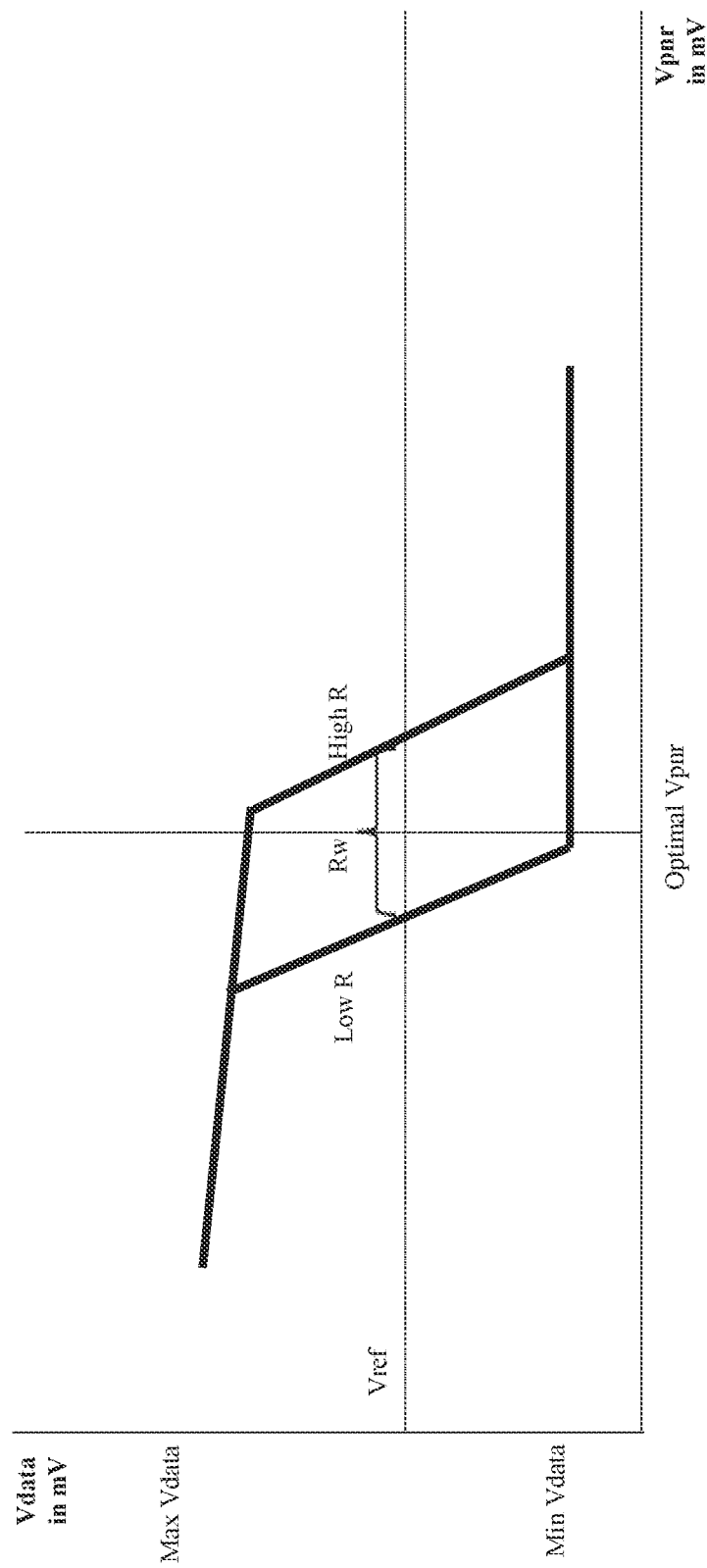
FIG. 8A is a graph illustrating an illustrative read window for a sense circuit as shown in FIG. 1A or FIG. 1B given a nominal operating temperature and using a fixed Vppr.
Figure 8C:
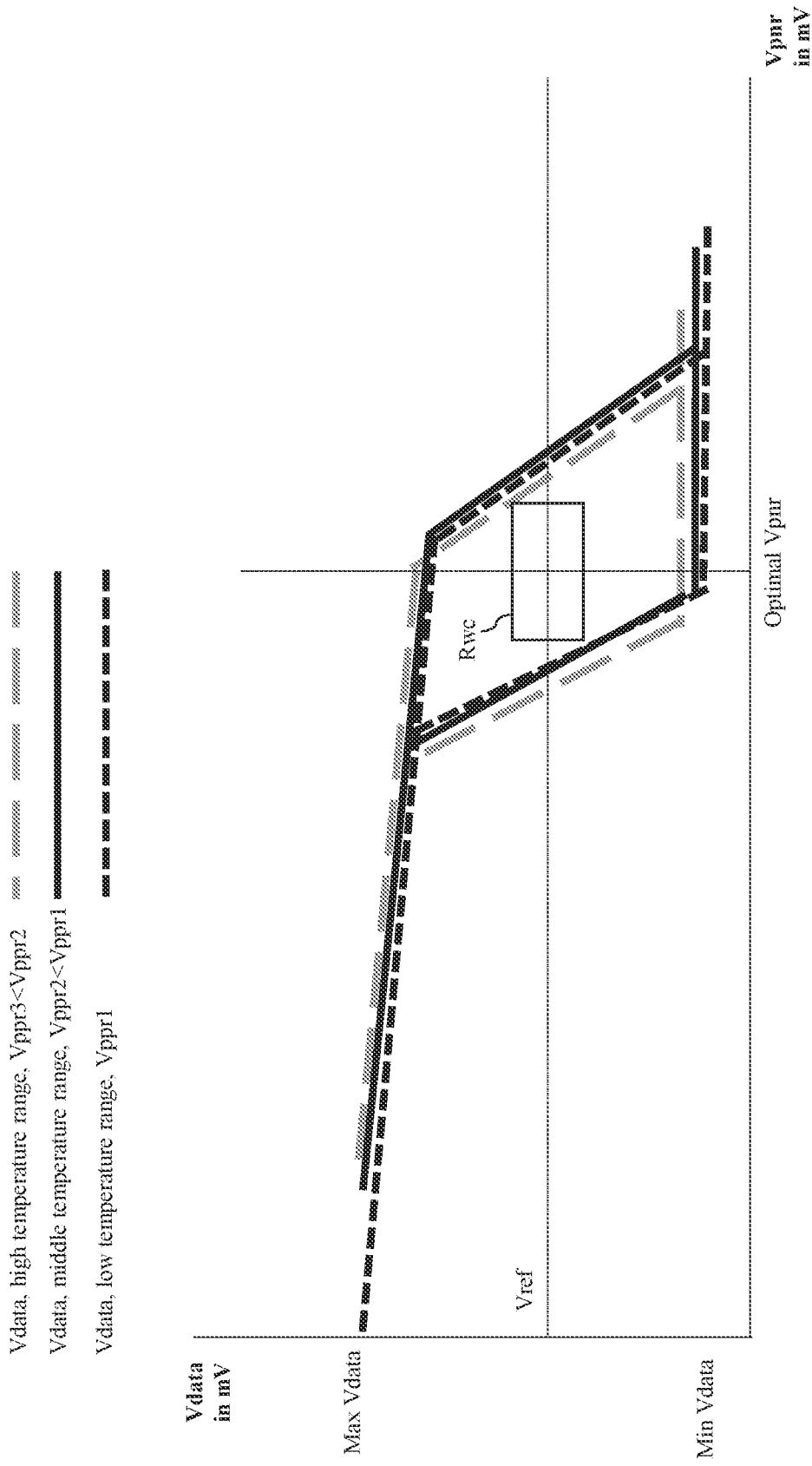
FIG. 8C is a graph illustrating a common read window achievable across multiple operating temperatures when using different Vpprs for different temperature ranges, respectively.

As illustrated in FIG. 8C, one technique that can be employed to compensate for temperature dependent Rw shifts is to use a variable first gate bias voltage (Vppr) (i.e., to modulate Vppr) so that it is at different voltage levels for different temperature ranges. Specifically, the structure can be configured to switch between multiple different Vpprs depending upon the operating temperature. For example, a first Vppr (Vppr1), which is relatively low (e.g., at 365 mV or some other suitable low Vppr1) could be used for the low temperature range, a second Vppr (Vppr2) that is higher than Vppr1 (e.g., at 385 mV or some other suitable middle Vppr2) could be used for the middle temperature range (i.e., at normal operating temperatures), and a third Vppr (Vppr3) that is higher than the Vppr2 (e.g., at 425 mV or some other suitable high Vppr3) could be used for the high temperature range. By adjusting the Vppr upward for different temperature ranges between low and high ranges, the corresponding read window shifts upward. Thus, a common read window (Rwc) can be established across all operating temperatures and the same fixed optimal Vpnr can be used. Circuits capable of generating multiple different bias voltages and switching the voltage output as a function of temperature are well known in the art and, thus, the details thereof have been omitted from this specification in order to allow the reader to focus on the salient aspects of the disclosed embodiments.

Figure 9:
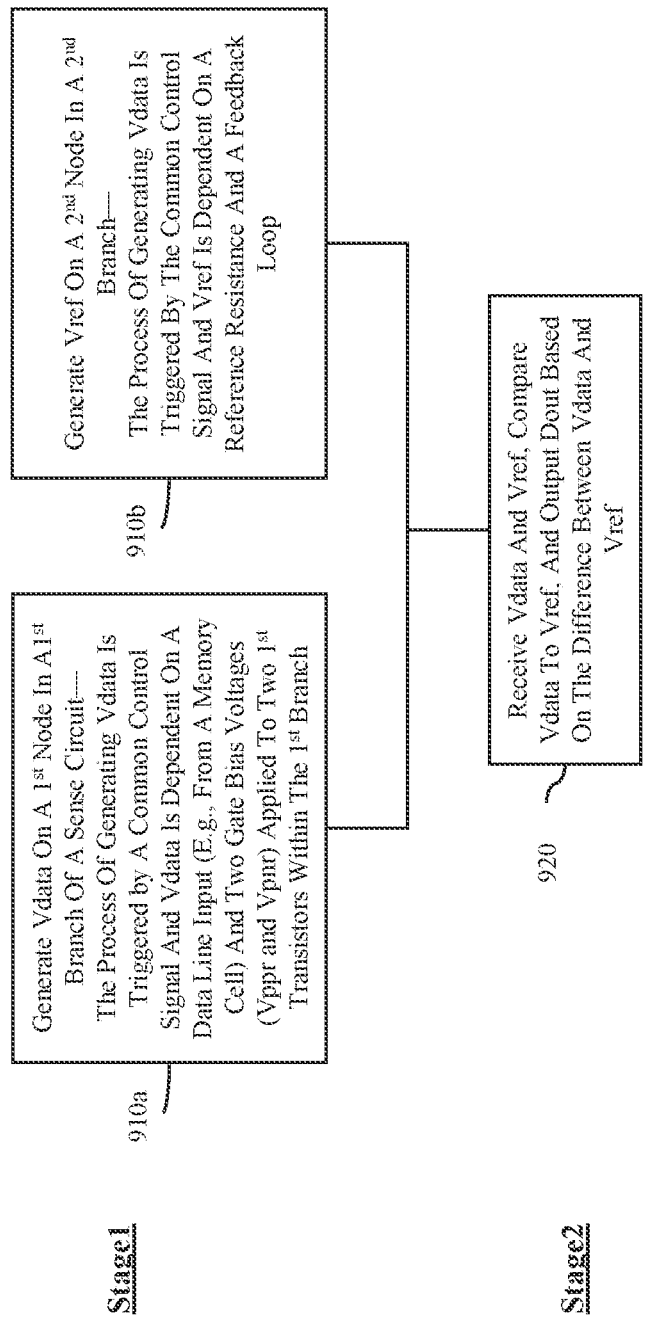
FIG. 9 is a flow diagram illustrating a method of operating a sense circuit within a memory structure (e.g., as in FIG. 1A or FIG. 1B) during performance of a two-stage read operation.

Referring to the flow diagram of FIG. 9 and the structure diagrams of FIGS. 1A and 1B, also disclosed herein are method embodiments for operating a sense circuit, such as the sense circuit 150A in the memory structure 100A of FIG. 1A or the sense circuit 150B in the memory structure 100B of FIG. 1B, as described in detail above, and particularly for performing a two-stage read operation using the sense circuit 150A, 150B.

The two-stage read operation can include performing a first stage (Stage1). Stage1 can include generating, by a first branch 181 of a sense circuit 150A, 150b, Vdata on a first node 155 (see process 910a). The first branch 181 can specifically include, e.g., at least a first PFET 154, a first NFET 153 and an additional first NFET 152, connected in series between a voltage rail (e.g., a positive voltage rail 185 at, for example, Vdd) and a DL 151. The first node 155 can be at a junction between two of the first transistors (e.g., the first PFET 154 and the first NFET 153) and can further be connected to a first input 161 of an amplifier 160 of the sense circuit 150A, 150B. This process of generating Vdata is triggered by a common control signal (SAMP) and, given the sense circuit structure, the voltage level of Vdata at the first node 155 is dependent on a DL 151 input (e.g., from a memory cell 101 via a MUX 193 and bitline 111). This DL 151 input will have a relatively high voltage level when the resistance of the current path through the memory cell connected to the bitline 111 is relatively high (e.g., when the memory cell or, more particularly, the programmable resistor or VT-programmable FET therein is programmed to a high resistance state, see FIGS. 2 and 6 and the discussion above regarding types of memory cells that could optionally be incorporated into the memory structure 100A of FIG. 1A or 100B of FIG. 1B). This DL 151 input will have a relatively low voltage level when the resistance of the current path through the memory cell connected to the bitline 111 is relatively low (e.g., when the memory cell or, more particularly, the programmable resistor or VT-programmable FET therein, is programmed to a low resistance state). Additionally, the voltage level of Vdata at the first node 155 will be dependent upon a pair of gate bias voltages (Vppr and Vpnr) applied to the gates of the two first transistors on either side of the first node 155 (e.g., Vppr can be applied to the gate of first PFET 154 and Vpnr can be applied to the gate of the first NFET 153).

In some embodiments, Vppr and Vpnr can be set at predetermined fixed values for a given read window (Rw) (e.g., see FIG. 8A and the discussion above). Alternatively, Vpnr can be set at a predetermined fixed value, but Vppr can be set at different values for different operating temperatures or, particularly, for different operating temperature ranges (e.g., Vppr1 for low operating temperatures, Vppr2 for normal operating temperatures, and Vppr3 for high operating temperatures) to compensate for temperature dependent Rw shifts. By shifting Vppr when the sense circuit 150A, 150B operates in different temperature ranges (e.g., shifting it up with the operating temperature is increased), the Rw can be tuned to remain essentially the same across the full operating temperature range.

Stage1 can also include generating, by a second branch 182 of the sense circuit 150A, 150B, Vref on a second node 158 (see process 910b). The second branch 182 can specifically include second transistors (e.g., a second PFET 156 and a second NFET 157) connected in series between the voltage rail (e.g., the positive voltage rail 185) and a reference device 159. The second node 158 can be at a junction between two of the second transistors (e.g., between the second PFET 156 and the second NFET 157) and can further be connected to a second input 162 of the amplifier 160 as well as to the gate of the second PFET 156. This process of generating Vref is also triggered by SAMP and given the sense circuit structure, the voltage level of Vref at the second node 158 is dependent a reference resistance (Rref) of the reference device 159. As discussed in greater detail above regarding the structure embodiments, the reference device 159 can be configured so that Rref is between (e.g., approximately mid-way between) stored data-dependent high and low resistances of a current path through a memory cell 101, as discussed above. Such an Rref facilitates generation of a Vref that is between (e.g., approximately mid-way between) the minimum and maximum voltage levels between which Vdata can swing. Additionally, the voltage level of Vref at the second node 158 will be dependent on a feedback loop. More particularly, the gate of the second PFET 156 can be connected to the second node 158 such that, if Vref drops too low, the second PFET 156 will pull Vref back up.

Since generation of Vdata and Vref in the first and second branches, respectively, is triggered by the same control signal (SAMP) and since Vdata and Vref are concurrently applied to the first and second inputs of the amplifier, operation of the first and second branches is in parallel. Additionally, because the current paths for the first and second branches are different and, more particularly, do not overlap at all and since different gate biases are used within the first and second branches (e.g., Vppr and Vpnr in the first branch and Vref in the second branches) to facilitate Vdata and Vref generation in the different branches, Vdata and Vref are independently generated during Stage1.

The two-stage read operation can further include performing a second stage (Stage2) after Stage1 (see process 920). Stage2 can be performed by the amplifier 160 and can include receiving Vdata and Vref and the first input 161 and second input 162, respectively. Stage2 can further include comparing Vdata to Vref (e.g., to determine whether Vdata>Vref or Vdata<Vref) and outputting Dout based on the difference. For example, when Vdata>Vref, the output can be a logic value of 0; whereas when Vdata<Vref, the output can be a logic value of 1.

The terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms such as "comprises", "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. While the details of one or more implementations of the disclosed embodiments are set forth in the accompanying drawings and described above, two or more aspects of the various implementations of any of the embodiments disclosed herein, including those described in this summary section, may be combined to form implementations not specifically described herein. Other features, objects and advantages will also be apparent from the description and drawings, and from the claims. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   an amplifier having a first input and a second input;
   a first branch comprising first transistors connected in series between a voltage rail and a data line, wherein a first node at a junction between two of the first transistors is connected to the first input; and
   a second branch comprising second transistors connected in series between the voltage rail and a reference device, wherein a second node at a junction between two of the second transistors is connected to the second input, wherein two of the first transistors receive corresponding gate bias voltages and wherein a different one of the first transistors and one of the second transistors receive a common control signal.

2. The structure of claim 1,
   wherein the first transistors comprise a P-type first transistor, an N-type first transistor, and an additional N-type first transistor connected in series between a positive voltage rail and the data line,
   wherein the first node is between the P-type first transistor and the N-type first transistor,
   wherein the second transistors comprise a P-type second transistor and an N-type second transistor connected in series between the positive voltage rail and the reference device,
   wherein the second node is between the P-type second transistor and the N-type second transistor and further connected to a gate of the P-type second transistor, and
   wherein gates of the additional N-type first transistor and the N-type second transistor receive the common control signal.

3. The structure of claim 2,
   wherein a gate of the P-type first transistor receives a first gate bias voltage,
   wherein a gate of the N-type first transistor receives a second gate bias voltage, and
   wherein a read window is dependent on the first gate bias voltage and the second gate bias voltage.

4. The structure of claim 3,
   wherein the first gate bias voltage is variable and at different voltage levels for different operating temperatures, and
   wherein the second gate bias voltage is fixed.

5. The structure of claim 2,
   wherein the first branch further comprises an additional P-type first transistor having a source region connected to the voltage rail and a drain region connected to the first node,
   wherein the second branch further comprises an additional P-type second transistor having a source region connected to the voltage rail and a drain region connected to a gate of the P-type second transistor and to the second node, and
   wherein gates of the additional P-type first transistor and the additional P-type second transistor receive a common pre-charge control signal.

6. The structure of claim 1,
   wherein the data line is connected to a memory cell,
   wherein the memory cell comprises an access transistor and a programmable resistor connected in series between a source line and a bitline, and wherein a gate of the access transistor is connected to a wordline.

7. The structure of claim 6,
wherein the programmable resistor comprises any of a magnetic tunnel junction-type programmable resistor, a phase change memory-type programmable resistor, and a memristor,
wherein the reference device comprises a reference resistor connected in series between the second transistors and ground, and
wherein a reference resistance of the reference resistor is at a level between a low programmed resistance of the programmable resistor and a high programmed resistance of the programmable resistor that is higher than the low programmed resistance.

8. The structure of claim 1,
wherein the data line is connected to a memory cell,
wherein the memory cell comprises a threshold voltage-programmable transistor connected between source and bitlines,
wherein a gate of the threshold voltage-programmable transistor is connected to a wordline,
wherein the reference device comprises a reference resistor connected in series between the second transistors and ground,
wherein the threshold voltage-programmable transistor has a low resistance when programmed to have a low threshold voltage and a high resistance that is higher than the low resistance when programmed to have a high threshold voltage that is higher than the low threshold voltage, and
wherein a reference resistance of the reference resistor is at a level between the low resistance and the high resistance.

9. The structure of claim 1,
wherein at the first input the amplifier receives a data voltage from the first node,
wherein at the second input the amplifier receives a reference voltage from the second node, and
wherein the amplifier compares the data voltage to the reference voltage and further outputs a digital output based on a difference between the data voltage and the reference voltage.

10. The structure of claim 9,
wherein the first input is an inverting input and the second input is a non-inverting input,
wherein the digital output has a logic value of 0 when the data voltage is higher than the reference voltage indicating that a current path through a specific memory cell connected to the data line has a high resistance, and
wherein the digital output has a logic value of 1 when the data voltage is lower than the reference voltage indicating that the current path through the specific memory cell connected to the data line has a low resistance that is less than the high resistance.

11. A structure comprising:
an array of memory cells arranged in columns and rows;
bitlines for the columns, wherein the memory cells in a column are connected to a bitline for the column;
wordlines for the rows, wherein the memory cells in a row are connected to a wordline for the row;
a multiplexor having bitline inputs and a data line output, wherein the bitline inputs are connected to the bitlines, wherein the data line output is connected to a data line, and wherein the multiplexor connects at least one of the bitlines to the data line; and
a sense circuit comprising:
an amplifier having a first input and a second input;
a first branch comprising first transistors connected in series between a voltage rail and the data line, wherein a first node at a junction between two of the first transistors is connected to the first input; and
a second branch comprising second transistors connected in series between the voltage rail and a reference device, wherein a second node at a junction between two of the second transistors is connected to the second input, wherein two of the first transistors receive corresponding gate bias voltages and wherein a different one of the first transistors and one of the second transistors receive a common control signal.

12. The structure of claim 11,
wherein the first transistors comprise a P-type first transistor, an N-type first transistor, and an additional N-type first transistor connected in series between a positive voltage rail and the data line,
wherein the first node is at a junction between the P-type first transistor and the N-type first transistor,
wherein the second transistors comprise a P-type second transistor and an N-type second transistor connected in series between the positive voltage rail and the reference device,
wherein the second node is at a junction between the P-type second transistor and the N-type second transistor and further connected to a gate of the P-type second transistor, and
wherein gates of the additional N-type first transistor and the N-type second transistor receive the common control signal.

13. The structure of claim 12,
wherein a gate of the P-type first transistor receives a first gate bias voltage,
wherein a gate of the N-type first transistor receives a second gate bias voltage, and
wherein a read window is dependent on the first gate bias voltage and the second gate bias voltage.

14. The structure of claim 13,
wherein the first gate bias voltage is variable and at different voltage levels for different operating temperatures, and
wherein the second gate bias voltage is fixed.

15. The structure of claim 12,
wherein the first branch further comprises an additional P-type first transistor having a source region connected to the voltage rail and a drain region connected to the first node,
wherein the second branch further comprises an additional P-type second transistor having a source region connected to the voltage rail and a drain region connected to a gate of the P-type second transistor and to the second node, and
wherein gates of the additional P-type first transistor and the additional P-type second transistor receive a common pre-charge control signal.

16. The structure of claim 11,
wherein each memory cell in a specific column and a specific row within the array comprises an access transistor and a programmable resistor connected in series between specific source and bitlines for the specific column, and
wherein a gate of the access transistor is connected to a specific wordline for the specific row.

17. The structure of claim 16,
wherein the programmable resistor comprises any of a magnetic tunnel junction-type programmable resistor, a phase change memory-type programmable resistor, and a memristor,
wherein the reference device comprises a reference resistor connected in series between the second transistors and ground, and
wherein a reference resistance of the reference resistor is at a level between a low programmed resistance of the programmable resistor and a high programmed resistance of the programmable resistor that is higher than the low programmed resistance.

18. The structure of claim 11,
wherein each specific memory cell in a specific column and a specific row within the array comprises a threshold voltage-programmable transistor connected between specific source and bitlines for the specific column,
wherein a gate of the threshold voltage-programmable transistor is connected to a specific wordline for the specific row,
wherein the reference device comprises a reference resistor connected in series between the second transistors and ground, and
wherein a reference resistance of the reference resistor is at a level between a low resistance of the threshold voltage-programmable transistor when programmed to have low threshold voltage and a high resistance of the threshold voltage-programmable transistor when programmed to have a high threshold voltage.

19. The structure of claim 11,
wherein the first input is an inverting input that receives a data voltage from the first node,
wherein the second input is a non-inverting input that the receives a reference voltage from the second node,
wherein the amplifier compares the data voltage to the reference voltage and further outputs a digital output based on a difference between the data voltage and the reference voltage,
wherein the digital output has a logic value of 0 when the data voltage is higher than the reference voltage indicating that a current path through a specific memory cell connected to the data line has a high resistance, and
wherein the digital output has a logic value of 1 when the data voltage is lower than the reference voltage indicating that the current path through the specific memory cell connected to the data line has a low resistance that is less than the high resistance.

20. A method comprising:
performing a first stage of a read operation, wherein the first stage comprises:
generating, by a first branch of a sense circuit, a data voltage on a first node, wherein the first branch comprises first transistors connected in series between a voltage rail and a data line and wherein the first node is at a junction between two of the first transistors and is connected to a first input of an amplifier of the sense circuit; and
generating, by a second branch of the sense circuit, a reference voltage on a second node, wherein the second branch comprises second transistors connected in series between the voltage rail and a reference device, wherein the second node is at a junction between two of the second transistors and is connected to a second input of the amplifier, wherein the generating of the data voltage and the generating of the reference voltage are performed concurrently and independently with two of the first transistors receiving corresponding gate bias voltages and wherein a different one of the first transistors and one of the second transistors receiving a common control signal; and
performing a second stage of the read operation, wherein the second stage comprises:
comparing, by the amplifier, the data voltage at the first input and the reference voltage at the second input; and
outputting, by the amplifier, a digital output based on a difference between the data voltage and the reference voltage.

* * * * *